United States Patent [19]

Wiggins

[11] 4,415,406
[45] * Nov. 15, 1983

[54] CHEMICAL ETCHING OF POLYMERS FOR METALLIZING

[75] Inventor: Wayne T. Wiggins, Aurora, Ohio

[73] Assignee: Standard Oil Company, Cleveland, Ohio

[*] Notice: The portion of the term of this patent subsequent to Oct. 14, 1997 has been disclaimed.

[21] Appl. No.: 128,327

[22] Filed: Mar. 7, 1980

[51] Int. Cl.$^3$ .............................................. B29C 17/08
[52] U.S. Cl. .................................. 156/668; 252/79.4; 427/304; 427/305; 427/306; 427/307
[58] Field of Search ............................... 427/304–307, 427/444; 156/668

[56] References Cited

U.S. PATENT DOCUMENTS

| | | | |
|---|---|---|---|
| 3,248,271 | 4/1966 | Rielly et al. | 427/307 |
| 3,370,974 | 2/1968 | Hepfer | 427/306 |
| 3,434,867 | 3/1969 | Rousselot | 427/307 |
| 3,895,169 | 7/1975 | Wichterle | 427/387 |
| 4,035,227 | 7/1977 | Doty | 427/307 |
| 4,227,963 | 10/1980 | Wiggins | 156/668 |

*Primary Examiner*—Norman Morgenstern
*Assistant Examiner*—Janyce A. Bell
*Attorney, Agent, or Firm*—David P. Yusko; Herbert D. Knudsen; Larry W. Evans

[57] ABSTRACT

The surfaces of polymer articles are conditioned for metallizing by treatment with an etching solution composed of a mixture of sulfuric acid and a carboxylic acid, such as formic or acetic acid.

14 Claims, No Drawings

CHEMICAL ETCHING OF POLYMERS FOR METALLIZING

This invention relates to the chemical etching of the surface of polymer articles, and more particularly pertains to the conditioning of polymer articles for metallizing by treatment thereof with a solution composed of a mixture of sulfuric acid and at least one carboxylic acid.

Chemical etching of the surfaces of polymer articles prior to metallizing with chromic-sulfuric acid combinations is well known and is the predominant present commercial process for making the polymer surface rough and hydrophilic for metallizing. See the "Encyclopedia of Polymer Science and Technology," Volume 8, pages 655–656, for instance. Chemical etching is presently commercially employed primarily in the preparation of ABS (acrylonitrile-butadiene-styrene) polymers for electroless metal plating. The plastic surfaces must be treated in some way to accept a chemical plating of copper or nickel, for instance. Adhesion of the copper to the plastic surface is very important because the coated copper is then used as the electrode for the electrodeposition of chrome in the chrome plating of the plastic.

As has been indicated above, normally the plastic surfaces are etched with a chromic acid-sulfuric acid mixture. The presence of chromic acid presents a waste-disposal problem (chromic acid is a bad water pollutant which is not easily removed) as well as a cost problem (chromic acid and its precursors are relatively expensive). In addition to the aforementioned problems, use of sulfuric acid-chromic acid etching solutions also often weakens the plastic which is exposed to such solutions which can result in an inferior finished metal-plated product.

I have discovered that the aforementioned problems mentioned for the usual sulfuric acid-chromic acid type etching solutions can be eliminated or greatly minimized by the use of an etching solution composed of sulfuric acid and a carboxylic acid such as formic acid.

Although a variety of of polymeric materials can be used in the present invention, preferred polymeric materials include rubbery polymers of one or more conjugated diene monomers such as butadiene, isoprene, piperylene, chloroprene, etc., including copolymers thereof with one or more comonomers such as styrene, alpha-methyl styrene, alkyl (meth)acrylates, (meth)acrylonitrile, etc., resinous copolymers of such diene with one or more such comonomers, polymers of one or more monovinylidene monomers such as acrylonitrile, methacrylonitrile, alkyl acrylates and methacrylates (e.g., methyl acrylate, ethyl acrylate, butyl acrylate, the corresponding methacrylates, etc.), monovinylidene aromatic monomers (e.g., styrene, alpha-methyl styrene, o-methyl and other ar-alkyl styrenes, p-chloro and other halo styrenes, vinyl naphthalene, etc.), vinyl chloride, vinyl acetate, vinyl ethers, indene, etc., and mixtures of such polymers.

Particularly useful are graft polymers of (a) a monovinylidene aromatic monomer such as styrene; alkyl styrenes, e.g., o-, m- and p-methyl styrenes, 2,5-dimethyl styrene, p-butyl styrene, etc.; halo styrenes, e.g., o-, m- and p-chloro styrenes, p-bromo styrene, 2,5-dichloro styrene, 2-chloro-4-methyl styrene, etc.; alpha-alkyl styrenes such as alpha-methyl styrene, vinyl naphthalene, and mixtures thereof and/or (b) an acrylic monomer such as acrylonitrile; methacrylonitrile; a $C_1$–$C_4$ alkyl acrylate or methacrylate, e.g. methyl acrylate, butyl methacrylate, etc.; and mixtures thereof or (c) a rubbery polymer of a conjugated diene, e.g., natural rubber, homopolymers of butadiene, isoprene, chloroprene, etc.; copolymers of two or more such dienes, copolymers of at least 50% by weight of one or more of such dienes with one or more comonomers such as the monovinylidene aromatic monomers and acrylic monomers mentioned above. Mixtures of graft copolymers and polymers of at least one of the monomers of the grafted phase of the graft copolymer can also be used.

Most preferred polymers for the purposes of this invention are those prepared by the polymerization of (A) from 60 to 90% by weight of at least one nitrile having the structure

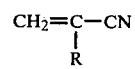

wherein R is hydrogen, a lower alkyl group having from 1 to 4 carbon atoms, or a halogen, (B) from 10 to 40% by weight based on the combined weight of (A) and (B) of at least one member selected from the group consisting of (1) an ester having the structure

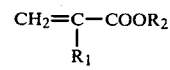

wherein $R_1$ is hydrogen, an alkyl group having from 1 to 4 carbon atoms or a halogen, and $R_2$ is an alkyl group having from 1 to 6 carbon atoms, (2) an alpha-olefin having the structure

wherein R' and R" are alkyl groups having from 1 to 7 carbon atoms, (3) a vinyl ether selected from the group consisting of methyl vinyl ether, ethyl vinyl ether, the propyl vinyl ethers, and the butyl vinyl ethers, (4) vinyl acetate, (5) styrene, and (6) indene, in the presence of from 0 to 40 parts by weight of (C) a rubbery polymer of a conjugated diene monomer selected from the group consisting of butadiene and isoprene and optionally a comonomer selected from the group consisting of styrene, a nitrile monomer having the structure

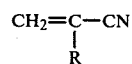

wherein R has the foregoing designation, and an ester having the structure

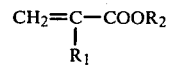

wherein $R_1$ and $R_2$ have the foregoing designations, said rubbery polymer containing from 50 to 100% by weight or polymerized conjugated diene and from 0 to 50% by weight of comonomer.

Carboxylic acids which can be used in conjunction with sulfuric acid in the etching solutions of this invention include at least one of formic, acetic, propionic, n-butyric, isobutyric, n-valeric, caproic acids, a lower di-carboxylic acid such as oxalic, malonic or succinic. Formic and acetic acids are preferred.

This invention is further illustrated in the following examples in which the amounts of ingredients are expressed in parts by weight unless otherwise specified.

EXAMPLE 1

A. A rubber latex was prepared by polymerizing with continuous agitation at 45° C. in the substantial absence of oxygen a mixture of the following ingredients:

| Ingredient | Parts |
| --- | --- |
| acrylonitrile | 40 |
| butadiene-1,3 | 60 |
| emulsifier (Gafac RE-610)* | 2.4 |
| azobisisobutyronitrile | 0.3 |
| t-dodecyl mercaptan | 0.5 |
| water | 200 |

*A mixture of $R-O-(CH_2CH_2O-)_nPO_3M_2$ and $[R-O-(CH_2CH_2O-)_n]_2PO_2M$ wherein n is a number of from 1 to 40, R is an alkyl or aralkyl group and preferably a nonyl phenyl group, and M is hydrogen, ammonia or an alkali metal, which composition is sold by GAF Corporation.

Before the reaction was started, the pH of the mixture was adjusted to about 8 with KOH. The polymerization was carried out for 22 and ½ hours to a conversion of about 33%.

B. An impact-resistant, gas-barrier resin was prepared by polymerization of a mixture of the following ingredients:

| Ingredient | Parts |
| --- | --- |
| acrylonitrile | 75 |
| methyl acrylate | 25 |
| latex A (above) rubber solids | 9 |
| potassium persulfate | 0.06 |
| emulsifier (Gafac RE-610) | 3 |
| t-dodecyl mercaptan | 1 |
| ethylene diamine tetra acetic acid | 0.05 |
| water | 200 |

The pH was adjusted to about 7 with $NH_4OH$. The polymerization was carried out in the substantial absence of molecular oxygen at 60° C. for 5 hours to produce a 91% conversion of a latex. The latex was coagulated with alum solution and the crumb was washed and dried.

EXAMPLE 2

A sheet was prepared by compression molding some of the resin of Example 1B. The sheet was 3 inches by 2 inches and 96 mils thick. This sheet was soaked in an etching bath made up of 360 parts of water, 552 parts of 96% concentrated sulfuric acid and 167.72 parts of 90% class IIIA formic acid for 10 minutes while the temperature of the wetting solution was maintained at 70° to 75° C. During the soaking, the wetting solution was vigorously agitated. After this, the wet sheet was then immersed for from 3 to 5 minutes in an etching bath made up of 300 parts of water, 552 parts of concentrated sulfuric acid and 167.72 parts of formic acid, which bath was maintained at 65° to 70° C. with agitation. The sheet was then immersed in a bath maintained at room temperature made up of 50 parts of 30% $NH_4OH$ and 50 parts of water for 1 minute with mild agitation. The sheet was then washed thoroughly with water and was then immersed in a bath maintained at room temperature containing 3 parts of water and 1 part of hydrogen chloride for 1 minute.

The sheet was then copper plated in a manner which involves immersing the sheet for 3 minutes in a catalyst bath composed of 300 parts of 50% hydrochloric acid, 800 parts of water, 5 parts of tin sulfate and 0.25 part of $SnCl_2$ with mechanical agitation at room temperature. The part is thoroughly water washed and immersed for 3 minutes in the aqueous accelerator bath consisting of 1000 parts of water by weight, 0.2 part of palladium chloride, 36 parts of oxalic acid, 6 parts of Na salt of poly alkyl naphthalene sulphonic acid and 0.1 part of dimethylamine borane with mechanical agitation at room temperature. The part is again thoroughly water washed and immersed for 10 minutes in the aqueous copper-plate bath consisting of 1000 parts of water by weight, 5 parts of Na sulphite, 0.48 part of Cu sulphate, 10.08 parts of ethylene diamine tetra acetic acid, 9.2 parts of NaOH, 2.4 parts of HCHO and 0.005 part of K and nickel cyanide.

There resulted a copper-plated part having excellent adhesion of the copper to the resin surface. The adhesion was tested after first thoroughly drying the copper-plated sheet and then thoroughly pressing a strong, pressure-sensitive duct tape from Nashua Corporation. This tape is called 357 olive drab duct tape with a cloth backing. The adhesive strength of the tape is rated at 45 ounces per linear inch. The tape adhesive is composed of natural rubber and natural reclaim rubber, petroleum resin and inorganic fillers. The duct tape was adhered to the coated surface followed by jerking the adhered tape away from the surface. Any adhesion failure shows up as an unplated spot on the surface of the sheet from which the tape was removed. Removal of copper from the coated surface of the sheet also gives a bright copper spot on the tape surface. In the instant case, the adhesion of copper to the surface of the etched sheet was excellent and the copper-plated sheet passed the tape test.

The copper-coated sheet was next subjected to a successive standard electrolyte deposition of (1) acid copper, (2) semi-brite nickel, (3) brite nickel and (4) chrome to produce a chrome-plated sheet. The acid-copper bath, semi-brite nickel bath, brite-nickel bath and chromium bath are described in Table 1. The plating conditions are given in Table 2.

It has also been discovered that the surfaces of polymer articles can be conditioned for metallizing by treatment with an etching solution wherein the sulfuric acid and/or carboxylic acid are partially or completely replaced by other acids. The advantage of these etching systems is that they do not contain any chromic acid or precursor thereof. Precursors of chromic acid are those compounds which will form this acid under the instant reaction condition. Examples of such precursors include dichromate and chromium trioxide.

The sulfuric acid can be at least partially replaced by acids which have a pH at 0.1 N of less than 2. Examples of such acids include hydrochloric acid, nitric acid, hydrofluoric acid, oxalic acid, sulfurous acid, phosphoric acid, sulfamic acid and perchloric, permanganic, chloric, hydrobromic acids. The carboxylic acid can be partially or wholly replaced by a halogenated carboxylic acid. Examples of these halogenated acids include chloroacetic acid, dichloroacetic acid and trichloroacetic acid.

The normality of the etching solution can vary quite widely. Preferably, the normality of the solution will be greater than 10 but less than 25. For a polymer containing 60 to 90% of an unsaturated nitrile, the preferred normality will be 16 to 20. For an ABS polymer, the etching solution normality is preferably 20 to 25. The normality can easily be adjusted by the addition or deletion of water.

TABLE 1

| | Parts by Weight |
|---|---|
| Acid-Leveling Copper Bath | |
| (Cu Flex ®; Dayton Bright Copper Company) | |
| $H_2O$ | 1000 |
| $CuSO_4.6H_2O$ | 224 |
| $H_2SO_4$ | 60 |
| HCl | 0.12 |
| 2:1 area/anode:cathode | |
| Bath Temperature | 70–80° F. |
| Vigorous Agitation | 40 asb |
| Semi-Brite Nickel Bath | |
| (Harshaw Perflow Nickel Plating Process) | |
| $H_2O$ | 1000 |
| $NiSO_4.6H_2O$ | 300 |
| $NiCl_2.6H_2O$ | 45 |
| $H_3BO_3$ | 41.2 |
| Perflow Addition | 0.48 |
| Perflow 110 | |
| Formaldehyde | 0.21 |
| Bath Temperature | 135° F. |
| pH | 4.3 |
| Vigorous Agitation | |
| Brite-Nickel Bath | |
| (Udylite Nickel Process No. 66) | |
| $H_2O$ | 1000 |
| $NiSO_4.6H_2O$ | 300–375 |
| $NiCl_2.6H_2O$ | 48–70.5 |
| $H_3BO_3$ | 45–48.7 |
| Na Fluoborate | 1.2 |
| Brightener No. 610 | |
| Wetting Agent No. 62 or No. J | |
| Bath Temperature | 135–160° F. |
| pH | 3.5–4.5 |
| | (4.0 optimum) |
| Air Agitation | 1–9 cfm/ft² surface |
| Chromium Bath | |
| $H_2O$ | 1000 |
| $CrO_3$ | 250 |
| $H_2SO_4$ | 2.5 |
| Bath Temperature | 120° F. |

TABLE 2

| Bath | Amps bar/in² | Thickness of Plate (mils) | Amp/ft² | Amp-hr/mil/ft² | Theoretical Plate Time (min.) |
|---|---|---|---|---|---|
| Acid Copper | .1–2.50 | 0.7 | 40 | 17.7 | 18.5 |
| Semi-Brite Nickel | 3.0 | 0.5 | 50 | 19.0 | 11.3 |
| Brite Nickel | 3.0 | 0.3 | 50 | 19.0 | 6.8 |
| Chrome | 11.0 | 0.01 | 175 | 52 | 1.2 |

The resulting chrome-plated sheet was subjected to the following heating cycles three times: (a) 1 hour at 180° F., (b) 15 minutes at room temperature, (c) 1 hour at −40° C. and (d) 15 minutes at room temperature. The thus-treated chrome-plated sheet was tested for adhesion of the metal coating to the resin by the duct-tape test mentioned above and by an attempt to force a sharp knife between the metal-plastic interface and prying the metal from the plastic. Both tests failed to cause any separation of the metal and plastic.

EXAMPLE 3

A commercially available ABS resin (acrylonitrile, butadiene, styrene) from Borg-Warner Chemicals designated VPB-3570 and composed of 25 parts of acrylonitrile, 15–17 parts of butadiene, 55–60 parts of styrene, 6–8 parts of $TiO_2$ and about 2 parts of carbon black was molded into a sheet 100 mils thick and 4 inches by 4 inches. This sheet was first immersed in a wetting bath composed of 100 parts of water, 552 parts of 96% standard concentrated sulfuric acid and 314.70 parts of 99.7% class II acetic acid for 10 minutes while the bath was maintained at 75° C. with vigorous agitation. The sheet was then transferred to an etching bath maintained at 70° C. and composed of a solution of 25 parts of water, 552 parts of concentrated sulfuric acid and 314.70 parts of acetic acid for from 1 to 3 minutes. Next, the etched sheet was transferred to a solution of 70 parts of water and 30 parts of 30% $NH_4OH$ for 1 minute at room temperature with mild agitation. The sheet was then moved to a stronger neutralizing bath consisting of 100 parts of 30% $NH_4OH$ for 30 seconds. The sheet was then rinsed thoroughly with water and was immersed in a 3-part-water, 1-part-hydrogen-chloride bath (room temperature) for 3 minutes. The copper and chrome plating were then carried out as described in Example 1. The metal-plated sheet was found to be uniformly plated having excellent adhesion as defined in Example 1.

EXAMPLE 4

A sheet of the resin described in Example 1 was prepared as described in Example 2. This sheet was then soaked in an etching bath composed of 300 parts of water, 552 parts of sulfuric acid and 183.78 parts of acetic acid for from 3 to 5 minutes at 65° to 70° C. with vigorous agitation. The etched part was then immersed in water for 1 minute and was then immersed in 50 parts of 30% $NH_4OH$ and 50 parts of water for 2 minutes. The part was washed again with water and immersed in a solution of 3 parts of water and 1 part of HCl for 1 minute. The chrome-plating operation described in Example 2 was then followed. A final chrome-plated plastic sheet was produced which had an excellent bond between the metal coating and the resin surface.

EXAMPLE 5

The procedure of Example 2 was repeated except that the etching bath contained 300 parts of water, 552 parts of sulfuric acid and no carboxylic acid. The metal-plated part was found to have essentially no adhesion between the copper coating and the resin surface by the duct-tape test. This experiment is outside the scope of this invention.

EXAMPLE 6

Another experiment which is outside the scope of this invention was performed by repeating the procedure of Example 2 using an etching bath composed of 300 parts of water, 314.7 parts of acetic acid and no sulfuric acid. The copper-plated sheet was found to have essentially no adhesion between the metal coating and the resin surface by the duct-tape test.

I claim:

1. A method for preparing the surface of a nitrile containing polymer article for metallizing comprising etching said surface with a mixture of (a) an acid having a pH at 0.1 N of less than 2, and (b) a monocarboxylic or halogenated monocarboxylic acid in the absence of chromic acid or precursor thereof.

2. The method of claim 1 wherein (a) is sulfuric acid.

3. The method of claim 1 wherein (b) is selected from the group consisting of acetic acid and formic acid.

4. The method of claim 1 wherein (a) is selected from the group consisting of hydrochloric acid, nitric acid, phosphoric acid, sulfuric acid, sulfamic acid, hydrofluoric acid, oxalic acid, sulfurous acid and perchloric, permanganic, chloric, hydrobromic acids.

5. The method of claim 1 wherein (a) is a mixture of acids.

6. The method of claim 1 wherein the normality of the etching solution is greater than 10 but less than 25.

7. The method of claim 1 wherein the polymer is ABS.

8. The method of claim 7 wherein the normality of the etching solution is 20 to 25.

9. The method of claim 1 wherein the polymer is one prepared by the polymerization of
(A) from 60 to 90% by weight of at least one nitrile having the structure

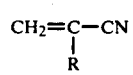

wherein R is hydrogen, a lower alkyl group having from 1 to 4 carbon atoms, or a halogen,
(B) from 10 to 40% by weight based on the combined weight of (A) and (B) of at least one member selected from the group consisting of
(1) an ester having the structure

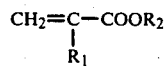

wherein $R_1$ is hydrogen, an alkyl group having from 1 to 4 carbon atoms or a halogen, and $R_2$ is an alkyl group having from 1 to 6 carbon atoms,
(2) an alpha-olefin having the structure

wherein R' and R'' are alkyl groups having from 1 to 7 carbon atoms,
(3) a vinyl ether selected from the group consisting of methyl vinyl ether, ethyl vinyl ether, the propyl vinyl ethers, and the butyl vinyl ethers,
(4) vinyl acetate,
(5) styrene, and
(6) indene,
in the presence of from 0 to 40 parts by weight of
(C) a rubbery polymer of a conjugated diene monomer selected from the group consisting of butadiene and isoprene and optionally a comonomer selected from the group consisting of styrene, a nitrile monomer having the structure

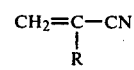

wherein R has the foregoing designation, and an ester having the structure

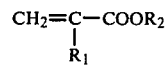

wherein $R_1$ and $R_2$ have the foregoing designations, said rubbery polymer containing from 50 to 100% by weight of polymerized conjugated diene and from 0 to 50% by weight of comonomer.

10. The method of claim 9 wherein the normality of the etching solution is 16 to 20.

11. The method of claim 9 wherein the ratio of (a):(b) is 1:0.5–0.7.

12. The method of claim 7 wherein the ratio of (a):(b) is 1:0.5–1.5.

13. The method of claim 1 wherein the pH at 0.1 N is greater than 1.0 but less than 1.6.

14. The method of claim 1 wherein (a) is selected from the group consisting of nitric acid, phosphoric acid, sulfamic acid, hydrofluoric acid, oxalic acid, sulfurous acid and perchloric, permanganic, chloric, hydrobromic acid.

* * * * *